United States Patent
Xu et al.

(10) Patent No.: US 6,599,399 B2
(45) Date of Patent: *Jul. 29, 2003

(54) SPUTTERING METHOD TO GENERATE IONIZED METAL PLASMA USING ELECTRON BEAMS AND MAGNETIC FIELD

(75) Inventors: Zheng Xu, Foster City, CA (US); Seshadri Ramaswami, San Jose, CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 325 days.

(21) Appl. No.: 08/812,657

(22) Filed: Mar. 7, 1997

(65) Prior Publication Data

US 2002/0005348 A1 Jan. 17, 2002

(51) Int. Cl.$^7$ ............................................. C23C 14/34
(52) U.S. Cl. ........................... 204/192.12; 204/192.25; 204/298.16; 204/298.19
(58) Field of Search ....................... 204/192.11, 192.25, 204/192.34, 298.04, 298.05, 298.11, 298.16, 298.36, 298.37, 298, 38, 192.12, 298.19; 118/728; 427/569, 576, 582, 584, 585

(56) References Cited

U.S. PATENT DOCUMENTS 4,336,118 A * 6/1982 Patten et al. .......... 204/192 EC
4,362,632 A    12/1982 Jacob .................... 118/723 IR (List continued on next page.)

FOREIGN PATENT DOCUMENTS

| EP | 0149408 | 7/1985 |
|---|---|---|
| EP | 0520519 | 12/1992 |

(List continued on next page.)

OTHER PUBLICATIONS

M. Matsuoka et al.; "Dense plasma production and film deposition by new high–rate sputtering using an electric mirror"; J. Vac. Sci. Technol. A 7(4); pp. 2652–2657, Jul. 1989.*
Search Report in European Application No. 96308251.6.
U.S. Ser. No. 08/680,335 (Atty. Dkt. 1390 CIP).

(List continued on next page.)

*Primary Examiner*—Nam Nguyen
*Assistant Examiner*—Gregg Cantelmo
(74) *Attorney, Agent, or Firm*—Kohrad, Raynes, Victor & Mann LLP

(57) ABSTRACT

A deposition system in a semiconductor fabrication system provides at least one electron gun which injects energetic electrons into a semiconductor fabrication chamber to initiate and sustain a relatively high density plasma at extremely low pressures. In addition to ionizing atoms of the extremely low pressure gas, such as an argon gas at 100 microTorr, for example, the energetic electrons are also believed to collide with target material atoms sputtered from a target positioned above a substrate, thereby ionizing the target material atoms and losing energy as a result of the collisions. Preferably, the electrons are injected substantially tangentially to the walls of a chamber shield surrounding the plasma in a magnetic field generally parallel to a central axis of the semiconductor fabrication chamber connecting the target to and the substrate. As the injected electrons lose energy ionizing the target material atoms, the electrons spiral inward toward a central region of the semiconductor fabrication chamber surrounding the central axis, forming an electron cloud in the central region. An arrangement of electromagnets may be positioned adjacent the walls of the chamber shield surrounding the plasma to generate the magnetic field. It is believed that the configuration of magnetic fields also keeps electrons from colliding with the walls of the chamber shield surrounding the plasma.

22 Claims, 6 Drawing Sheets

U.S. PATENT DOCUMENTS

| | | | | |
|---|---|---|---|---|
| 4,389,299 A | * | 6/1983 | Adachi et al. | 204/298.05 |
| 4,588,490 A | | 5/1986 | Cuomo et al. | |
| 4,626,312 A | | 12/1986 | Tracy | 156/345 |
| 4,661,228 A | | 4/1987 | Mintz | 204/192.25 |
| 4,692,230 A | * | 9/1987 | Nihei et al. | 204/298.05 |
| 4,716,491 A | | 12/1987 | Ohno et al. | 361/230 |
| 4,792,732 A | | 12/1988 | O'Loughlin | |
| 4,842,703 A | | 6/1989 | Class et al. | 204/192.12 |
| 4,844,775 A | | 7/1989 | Keeble | 216/68 |
| 4,865,712 A | | 9/1989 | Mintz | 204/298.16 |
| 4,871,421 A | | 10/1989 | Ogle et al. | 438/710 |
| 4,918,031 A | | 4/1990 | Flamm et al. | 204/192.25 |
| 4,925,542 A | | 5/1990 | Kidd | 427/531 |
| 4,941,915 A | | 7/1990 | Matsuoka et al. | 204/298.12 |
| 4,948,458 A | | 8/1990 | Ogle | 438/729 |
| 4,990,229 A | | 2/1991 | Campbell et al. | 204/298.06 |
| 4,999,096 A | | 3/1991 | Nihei et al. | 204/192.3 |
| 5,015,493 A | * | 5/1991 | Gruen | 204/298.05 |
| 5,065,698 A | | 11/1991 | Koike | 118/719 |
| 5,091,049 A | | 2/1992 | Campbell et al. | 216/37 |
| 5,110,435 A | * | 5/1992 | Haberland | 204/298.05 |
| 5,122,251 A | | 6/1992 | Campbell et al. | 204/298.06 |
| 5,135,629 A | | 8/1992 | Sawada et al. | 204/192.12 |
| 5,146,137 A | | 9/1992 | Gesche et al. | 315/111.31 |
| 5,175,608 A | | 12/1992 | Nihei et al. | 257/751 |
| 5,178,739 A | * | 1/1993 | Barnes et al. | 204/192.12 |
| 5,202,008 A | | 4/1993 | Talieh et al. | |
| 5,206,516 A | | 4/1993 | Keller et al. | 250/492.2 |
| 5,225,740 A | | 7/1993 | Ohkawa | 315/111.41 |
| 5,231,334 A | | 7/1993 | Paranjpe | 156/345 |
| 5,234,560 A | | 8/1993 | Kadlec et al. | 204/192.12 |
| 5,241,245 A | | 8/1993 | Barnes et al. | 315/111.41 |
| 5,280,154 A | | 1/1994 | Cuomo et al. | 156/345 |
| 5,304,279 A | | 4/1994 | Coultas et al. | 156/345 |
| 5,312,717 A | | 5/1994 | Sachdev et al. | 430/313 |
| 5,346,578 A | | 9/1994 | Benzing et al. | 156/345 |
| 5,346,600 A | * | 9/1994 | Nieh et al. | 204/298.05 |
| 5,361,016 A | | 11/1994 | Ohkawa et al. | 315/111.41 |
| 5,366,590 A | | 11/1994 | Kadomura | 438/723 |
| 5,368,685 A | | 11/1994 | Kumihashi et al. | 156/345 |
| 5,397,962 A | | 3/1995 | Moslehi | 315/111.51 |
| 5,404,079 A | | 4/1995 | Ohkuni et al. | 315/111.81 |
| 5,418,431 A | | 5/1995 | Williamson et al. | 315/111.51 |
| 5,421,891 A | | 6/1995 | Campbell et al. | 118/723 R |
| 5,427,668 A | | 6/1995 | Sato et al. | 204/298.05 |
| 5,429,070 A | | 7/1995 | Campbell et al. | 118/723 R |
| 5,429,710 A | | 7/1995 | Akiba et al. | 438/714 |
| 5,429,995 A | | 7/1995 | Nishiyama et al. | 438/788 |
| 5,430,355 A | | 7/1995 | Paranjpe | 315/111.21 |
| 5,503,676 A | | 4/1996 | Shufflebotham et al. | 118/723 MR |
| 5,573,595 A | | 11/1996 | Dible | 118/723 MP |
| 5,803,977 A | * | 9/1998 | Tepman et al. | 118/728 |

FOREIGN PATENT DOCUMENTS

| | | |
|---|---|---|
| EP | 0607797 | 1/1994 |
| EP | 0584483 | 3/1994 |
| EP | 607797 | 7/1994 |
| FR | 2732818 | 10/1996 |
| GB | 2162365 | 1/1986 |
| GB | 2231197 | 11/1990 |
| JP | 59-190363 | 10/1984 |
| JP | 61-190070 | 8/1986 |
| JP | 61190070 | 8/1986 |
| JP | 6025846 | 2/1994 |
| JP | 6232055 | 8/1994 |
| JP | 6283470 | 10/1994 |
| JP | 7176398 | 7/1995 |
| JP | 7176399 | 7/1995 |
| JP | 8153712 | 6/1996 |
| JP | 8288259 | 11/1996 |
| WO | WO860623 | 11/1986 |
| WO | 9606923 | 11/1986 |

OTHER PUBLICATIONS

U.S. Ser. No. 08/733,620 (Atty. Dkt. 1457).

U.S. Ser. No. 08/741,708 (Atty. Dkt. 1590).

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Metal Ion Deposition from Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett,*, vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. B13, pp. 125–129, 1995.

Y–W. Kim et al., "Directed Sputter Deposition of AlCu: Film Microstructure and Chemistry," *J. Vac. Sci. Technol.*, vol. A12, pp. 3169–3175, 1994.

J. Hopwood et al., "Mechanisms for Highly Ionized Magnetron Sputtering," *J. Appl. Phys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

N. Jiwari et al., "Helicon wave plasma reactor employing single–loop antenna," *J. of Vac. Sci. Technol.*, A 12(4), pp. 1322–1327, Jul./Aug. 1994.

SI 9800391–6 Written Opinion mailed Mar. 22, 2001 (Atty Dkt 5116SI).

EP 98301667, Search Report issued Aug. 31, 2000.

* cited by examiner

SPUTTERING METHOD TO GENERATE IONIZED METAL PLASMA USING ELECTRON BEAMS AND MAGNETIC FIELD

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Low density plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent to the target impact the surface of the target to dislodge, i.e., "sputter" material from the target. The sputtered materials are then transported and deposited on the surface of the semiconductor wafer.

Sputtered material has a tendency to travel in straight line paths from the target to the substrate being deposited, at angles which are oblique to the surface of the substrate. As a consequence, materials deposited in etched trenches and holes of semiconductor devices having trenches or holes with a high depth to width aspect ratio, can bridge over causing undesirable cavities in the deposition layer. To prevent such cavities, the sputtered material can be redirected into substantially vertical paths between the target and the substrate by negatively charging the substrate to position vertically oriented electric fields adjacent the substrate if the sputtered material is sufficiently ionized by the plasma. However, material sputtered in a low density plasma often has an ionization degree of less than 1% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance-matching network, such that the coil acts as the first windings of a transformer. The plasma acts as a single turn second winding of a transformer.

In a number of deposition chambers such as a physical vapor deposition chamber, the chamber walls are often formed of a conductive metal such as stainless steel. Because of the conductivity of the chamber walls, it is often necessary to place the antenna coils or electrodes within the chamber itself because the conducting chamber walls would block or substantially attenuate the electromagnetic energy radiating from the antenna. As a result, the coil and its supporting structures are directly exposed to the deposition flux and energetic plasma particles. This is a potential source of contamination of the film deposited on the wafer, and is undesirable.

To protect the coils, shields made from nonconducting materials, such as ceramics, can be placed in front of the coil. However, many deposition processes involve deposition of conductive materials such as aluminum on the electronic device being fabricated. Because the conductive material will coat the ceramic shield, it will soon become conducting, thus again substantially attenuating penetration of electromagnetic radiation into the plasma. Consequently, it is preferred to place a shield wall behind the coil to protect the interior of the deposition chamber from the deposition material. However, the problem of particulate matter remains for sputtering chambers of this design.

SUMMARY OF THE PREFERRED EMBODIMENTS

It is an object of the present invention to provide an improved method and apparatus for generating a plasma within a chamber and for sputter-depositing a layer which obviate, for practical purposes, the above-mentioned limitations.

These and other objects and advantages are achieved by, in accordance with one aspect of the invention, a plasma-generating apparatus which comprises at least one electron source which injects energetic electrons into a semiconductor fabrication chamber to initiate and sustain a relatively high density plasma at extremely low pressures. In addition to ionizing atoms of the extremely low pressure precursor gas, such as an argon gas at 100 microTorr, for example, the energetic electrons are also believed to collide with target material atoms sputtered from a target positioned above a substrate, thereby ionizing the target material atoms and losing energy as a result of the collisions. As a consequence, coils or other structures for inductively coupling RF power to sustain a plasma can be eliminated.

Preferably, the electrons are injected by electron guns positioned to inject the electrons substantially tangentially to the walls of a chamber shield surrounding the high density plasma into a confining magnetic field. The magnetic field is preferably oriented generally parallel to a central axis of the semiconductor fabrication chamber and substantially perpendicular to the surface of the substrate. As the injected electrons lose energy, colliding with and ionizing the target material atoms, and atoms of the extremely low pressure precursor gas, the electrons spiral inward toward a central region of the semiconductor fabrication chamber surrounding the central axis, forming an electron cloud in the central region. An arrangement of electromagnets may be positioned adjacent the walls of the chamber shield surrounding the high density plasma to generate the confining magnetic field. It is believed that the configuration of confining magnetic fields also keeps electrons from colliding with the walls of the chamber shield surrounding the high density plasma.

DETAILED DESCRIPTION OF THE DRAWINGS

Figure 1:
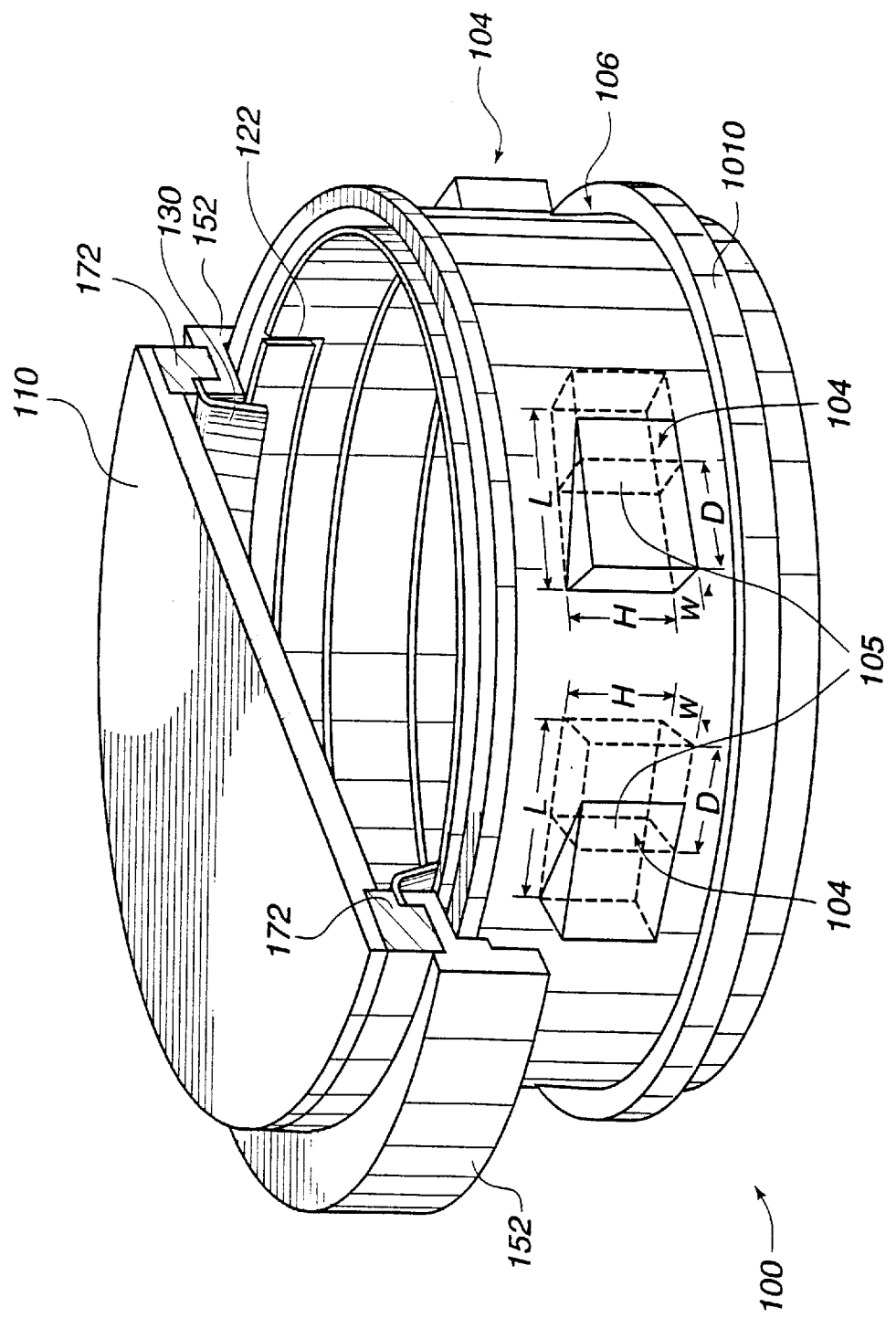
FIG. 1 is a perspective, partial cross-sectional view of a plasma-generating chamber in accordance with an embodiment of the present invention.
Figure 2:
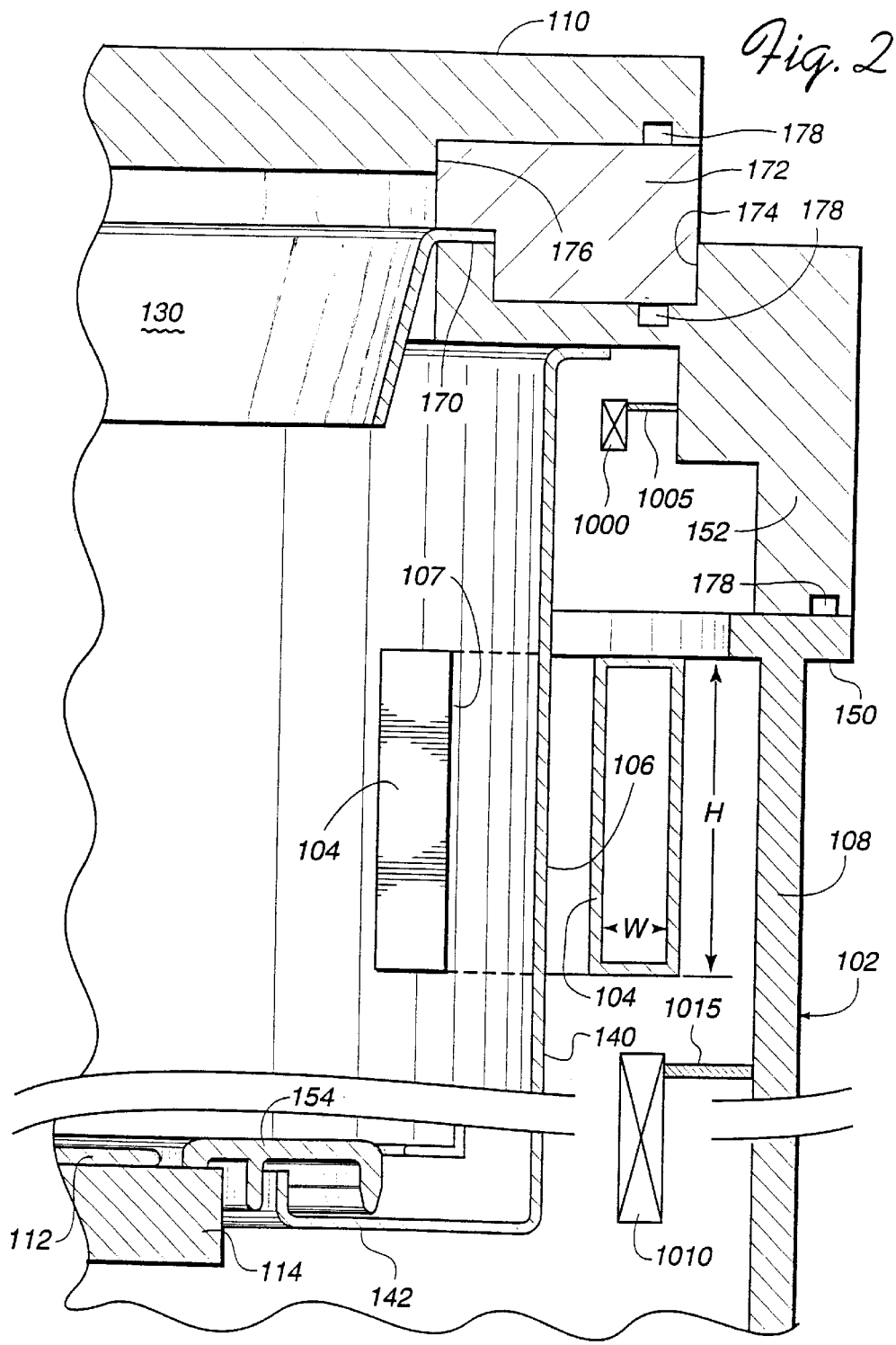
FIG. 2 is a partial cross-sectional view of the plasma-generating chamber of FIG. 1 shown installed in a vacuum chamber.
Figure 3:
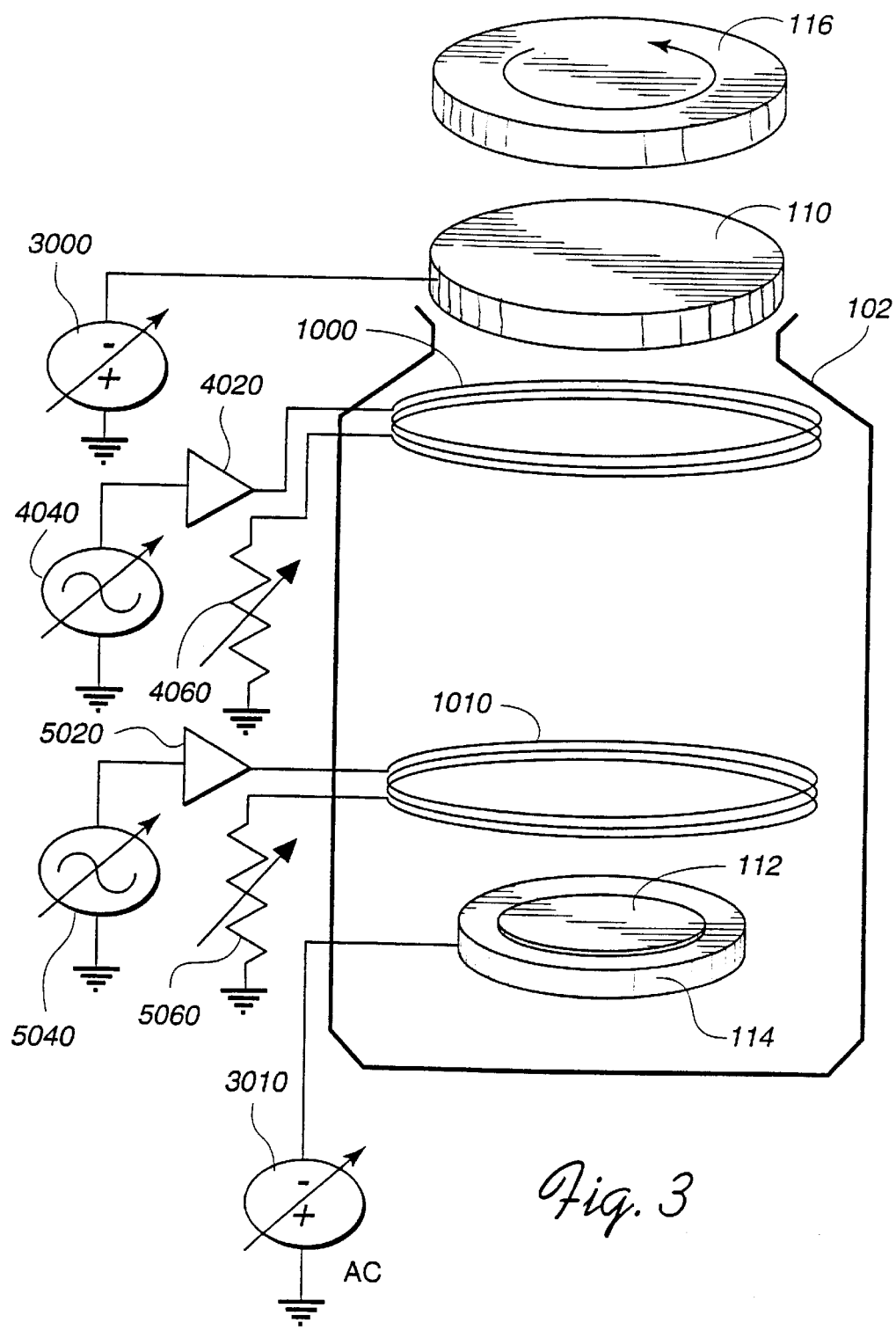
FIG. 3 is a schematic diagram of the electrical interconnections to the plasma-generating chambers of FIGS. 1–2.

Referring first to FIGS. 1–3, a plasma generator in accordance with an embodiment of the present invention comprises a substantially cylindrical deposition system 100 which is received in a vacuum chamber 102 (shown schematically in FIG. 3). The deposition system 100 of this embodiment has a chamber shield 106 that protects the interior walls 108 (FIG. 2) of the vacuum chamber 102 from the material being deposited within the interior of the deposition system 100.

An ion flux strikes a negatively biased target 110 positioned at the top of the vacuum chamber 102. The target 110 is negatively biased by a DC power source 3000. The ions eject material from the target 110 onto a substrate 112 which may be a wafer or other workpiece which is supported by a pedestal 114 at the bottom of the deposition system 100. A rotating magnetron magnet assembly 116 provided above the target 110 produces magnetic fields which sweep over the face of the target 110 to promote uniform erosion of the target.

In accordance with one aspect of the present invention, energetic electrons are injected into the interior of the deposition system 100 by one or more electron guns 104 arranged tangentially around the periphery of the deposition system 100, energizing a plasma 900 (FIG. 5) within the deposition system 100. The atoms of material ejected from the target 110 are in turn ionized by the electron cloud 900 such that the ionized deposition material is attracted to the substrate 112 to form a deposition layer thereon. The pedestal 114 may be negatively biased by an AC (or DC or RF) source so as to externally bias the substrate 112.

The electron guns 104 may be synchronized to inject the energetic electrons substantially continuously or in a pulsed manner. For example, using eight electron guns 104, each operating at an electron injection energy of about 20 keV and an electron current density of about 100 mAcm$^{-2}$, an electron density of about $5 \times 10^{12}$ cm$^{-3}$ may be generated in the high density electron cloud 900. As explained in greater detail below, a magnetic field is used to confine the high density electron cloud 900. The magnetic field strength needed to generate such a high density electron cloud 900 may be about 50 Gauss or less. Because the ionizing electrons are provided externally by the electron guns 104, the operation pressure of the argon (Ar) gas may be reduced to less than or equal to about $5 \times 10^{-4}$ Torr (0.5 milliTorr or 500 microTorr). It is believed that a high density electron cloud 900, with an electron density of about $5 \times 10^{12}$ cm$^{-3}$, in an argon (Ar) gas, at an extremely low operation pressure of less than or equal to about $5 \times 10^{-4}$ Torr, may advantageously be used. More target material atoms may be ionized by the high density electron cloud 900 while fewer target material ions may be deflected by the extremely low pressure argon (Ar) gas.

Figure 7:
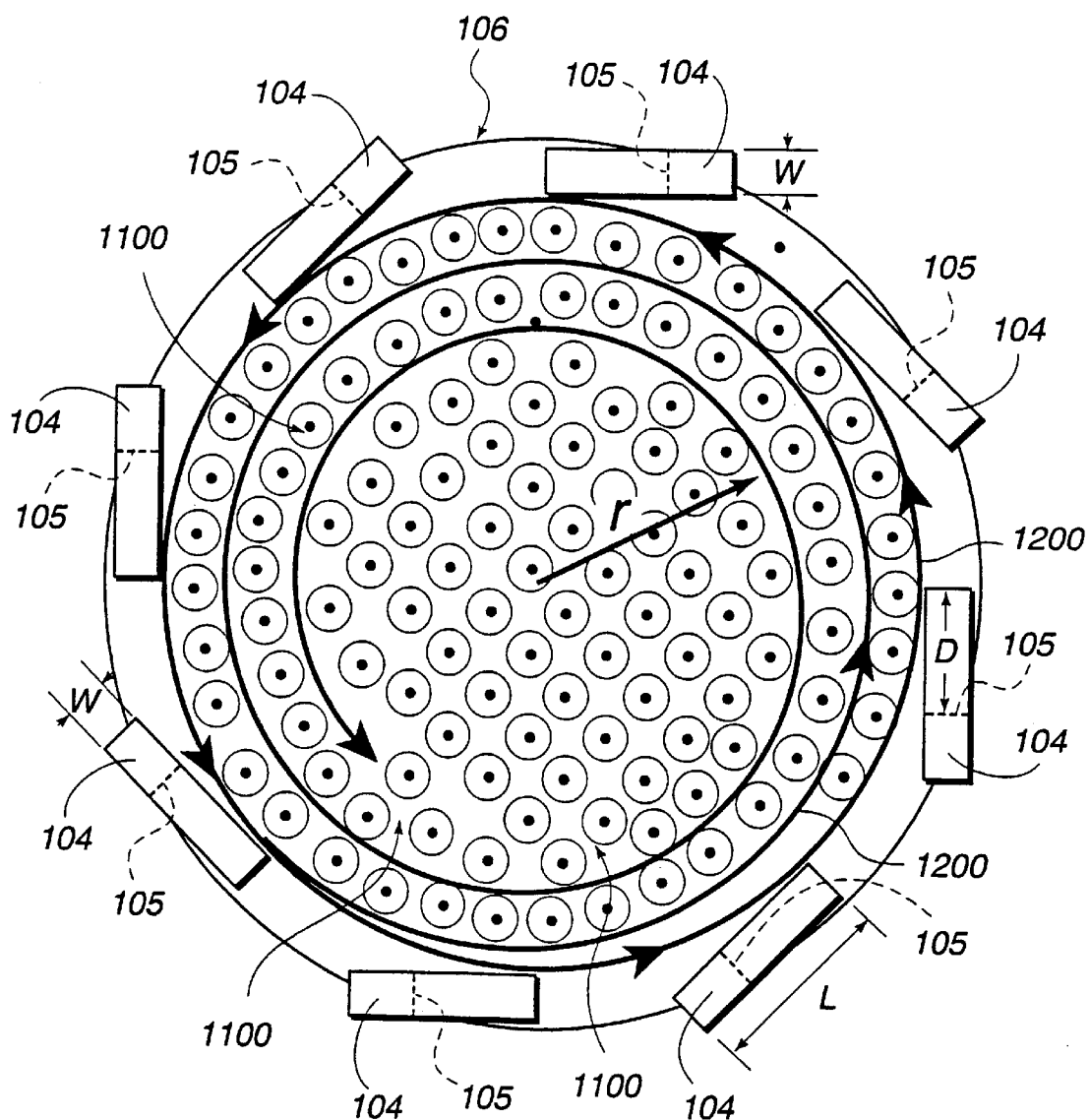
FIG. 7 is a schematic, plan view from above of electron trajectories of the plasma-generating chambers in accordance with the embodiments of FIGS. 1–4.

As shown in FIGS. 1 and 7, the electron guns 104 may have recessed windows 105 (shown in phantom) positioned a distance D from the end of the electron gun 104 exposed to the interior of deposition system 100. As shown, for example, in FIG. 2, the portion of the electron gun 104 exposed to the interior of deposition system 100 may pass through the wall 140 of the chamber shield 106 through a slot 107. The recessed windows 105 of the electron guns 104 allow the interior of the deposition system 100 to be maintained at a high vacuum. The distance D is chosen to be large enough (although necessarily less that the length L of the electron gun 104) so that window 105 is not plated over by the target material to be deposited on substrate 112 passing through the opening of the electron gun 104 having height H and width W (FIGS. 1 and 2), with aspect ratios chosen so that D/H is preferably greater than or equal to about 5 and H/W is preferably greater than or equal to about 2. While electron gun 104 is shown in FIG. 2 disposed on the interior of vacuum chamber wall 108, alternative embodiments may have one or more of the electron guns 104 extending outside of the vacuum chamber wall 108. Alternative sources for energetic electrons include "hot" filaments thermally emitting energetic electrons, and "cold" filaments using electron field emission, with "hot" emission being preferred using a tungsten or tantalum filament.

As will be explained in greater detail below, in accordance with one aspect of the present invention, the chamber shield 106 is magnetically shielded by magnetic fields generated by various types of magnets such as electromagnet coils 1000 and 1010 so as to minimize sputtering of material from the chamber shield 106. In addition, the deposition of target material onto the chamber shield 106 may also be reduced. As a consequence, contamination of the substrate 112 by material sputtered from the chamber shield 106 or by particulate matter shed by the chamber shield 106 may be reduced.

Figure 4:
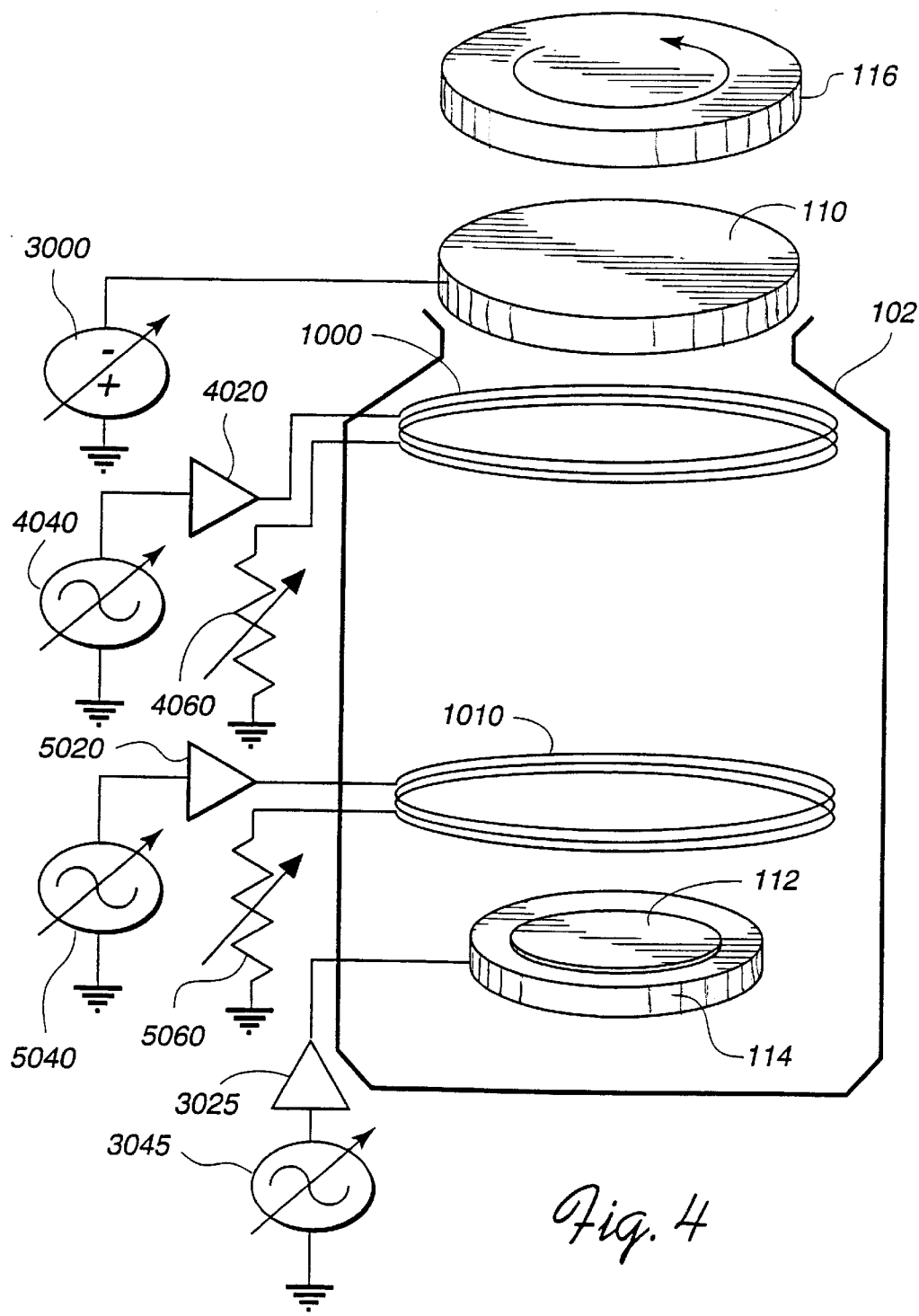
FIG. 4 is a schematic diagram of alternative electrical interconnections to the plasma-generating chambers of FIGS. 1–2.

FIG. 3 is a schematic representation of the electrical connections of the plasma generating apparatus of this illustrated embodiment. To attract the ions generated by the plasma, the target 110 is preferably negatively biased by a variable DC power source 3000. In the same manner, the pedestal 114 may be negatively biased by a variable DC power source 3010 to bias the substrate 112 negatively to attract the ionized deposition material to the substrate 112. In an alternative embodiment, as shown in FIG. 4, the pedestal 114 may be biased by a high frequency RF power source to bias the substrate 112 so as to attract the ionized deposition material more uniformly to the substrate 112. The pedestal 114 is coupled to an RF source such as the output of an amplifier and matching network 3025, the input of which is coupled to an RF generator 3045.

One end of the electromagnet coil 1000 may be coupled to a DC power source such as the output of a transformer and rectifying circuit 4020, the input of which is coupled to an AC power generator 4040. The other end of the electromagnet coil 1000 is coupled to ground, preferably through a resistor 4060, which may also be a variable resistor. Likewise, one end of the electromagnet coil 1010 may be coupled to a DC power source such as the output of a transformer and rectifying circuit 5020, the input of which is coupled to an AC power generator 5040. The other end of the electromagnet coil 1010 is coupled to ground, preferably through a resistor 5060, which may also be a variable resistor. Alternatively, both electromagnet coils 1000 and 1010 may be identical, or both may be coupled to a common DC power generator, of course, or one or more DC power sources may be used. One or more of the electromagnet coils such as 1000 and 1010 may be superconducting, using windings of high-temperature or low-temperature superconducting materials, cryogenically cooled as needed, and able to be disconnected from any power supply once energized.

Figure 5:
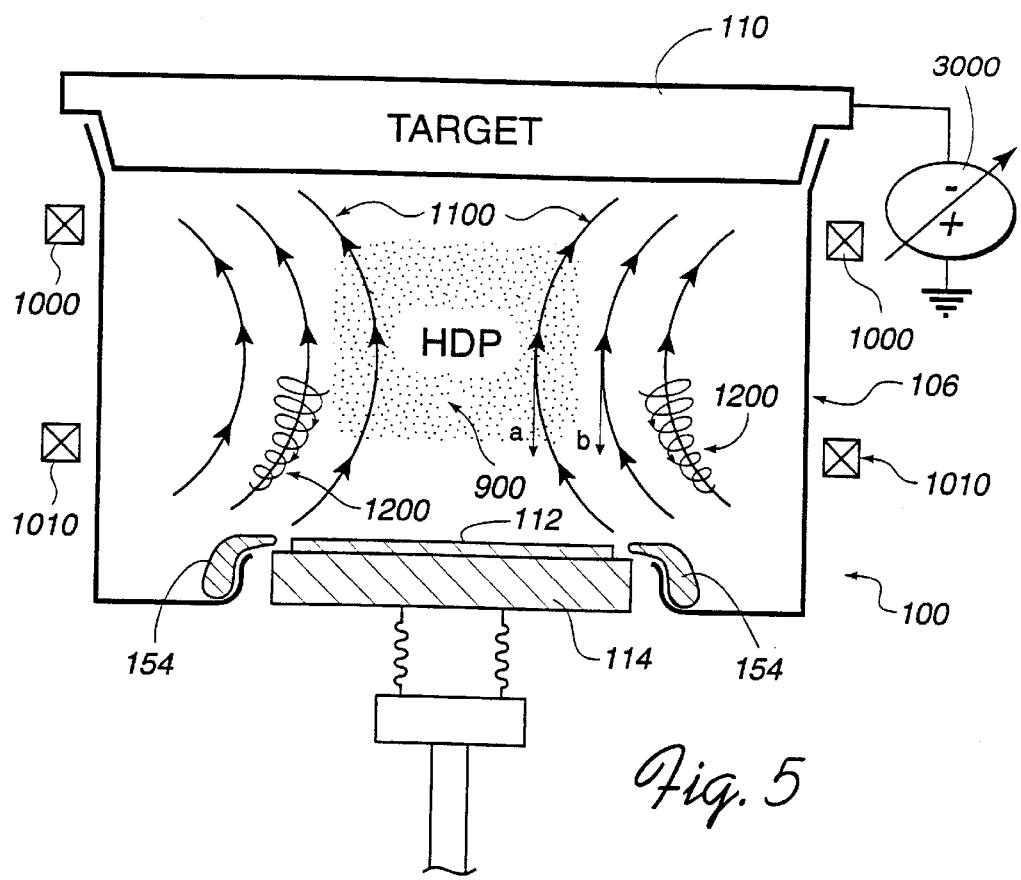
FIG. 5 is a schematic cross-sectional view of a plasma-generating chamber in accordance with the embodiments of FIGS. 1–4.

FIG. 5 schematically represents the operation of the electromagnet coils 1000 and 1010 to reduce the sputtering of material from the chamber shield 106, and to reduce the generation of particulate matter by the chamber shield 106, and hence reduce contamination of the substrate 112. As shown in FIG. 5, magnetic field lines 1100 are generated by the electromagnet coils 1000 and 1010, causing the energized electrons from the high density electron cloud 900 to spiral in helical paths 1200 around the magnetic field lines 1100, deflecting the energized electrons from impacting the chamber shield 106. The deflection of the energized electrons by the magnetic field lines 1100 also creates an electric field along the general direction of motion of the deflected electrons, deflecting energized ions of the high density electron cloud 900 and target material ions from impacting the chamber shield 106. Furthermore, the magnetic field lines 1100 are believed to squeeze the high density electron cloud 900 inward toward the central axis of the plasma chamber 100, creating a buffer region from a few mm up to a cm or more, depending on the strength of the magnetic field lines 1100, radially inward from the chamber shield 106, advantageously avoiding direct plasma heating of the chamber shield 106. This inhibits the energized electrons from lingering in the immediate vicinity of the chamber shield 106 and ionizing gas atoms and molecules that could sputter material from the chamber shield 106, which could in turn contaminate the substrate 112. Still further, the magnetic field lines 1100 can magnetically shield the chamber shield 106 to a limited extent from ionized deposition material which was originally ejected from the target 110. As a consequence, the accumulation of target material on the chamber shield 106 can be reduced, thereby reducing the formation of particulates that could subsequently dislodge from the chamber shield 106 and fall upon and contaminate the substrate 112. Typical magnetic field strengths generated by the electromagnet coils 1000 and 1010 in the region adjacent the chamber shield 106 may be in the range of 50–110 Gauss. Typical electron densities in the high density electron cloud 900 may be on the order of about $10^{12}$ cm$^{-3}$ to about $5 \times 10^{12}$ cm$^{-3}$. The operation pressure of the argon (Ar) gas may be less than or equal to about $5 \times 10^{-4}$ Torr (0.5 milliTorr or 500 microTorr).

Figure 6:
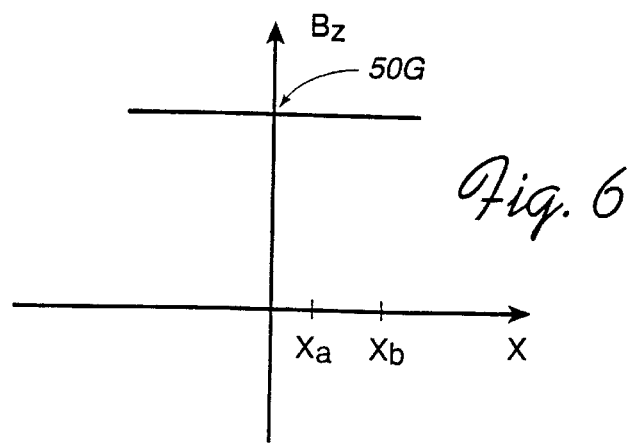
FIG. 6 is a graph schematically depicting the magnitude of the axial magnetic field strength of the magnetic field configuration of FIG. 5.

FIG. 6 schematically illustrates a preferred uniform arrangement for the magnitude of the magnetic field strength $B_z$ in the axial direction, plotted against the distance x from the central symmetry axis of the plasma chamber 100. For example, as shown in FIG. 6, the magnitude of the magnetic field strength a (FIG. 5) in the axial direction at the position $x_a$ closer to the central symmetry axis of the plasma chamber 100 is substantially the same as the magnitude of the magnetic field strength b (FIG. 5) in the axial direction at the position $x_b$ more distant from the central symmetry axis of the plasma chamber 100. Consequently, the influence of the magnetic field lines 1100 on the central region of the high density electron cloud 900 may be undiminished in such a preferred uniform arrangement for the magnitude of the magnetic field strength $B_z$ in the axial direction, and a uniform plasma may be generated. Typical values for the magnitude of the magnetic field strength $B_z$ in the axial direction, at all distances x from the central symmetry axis of the plasma chamber 100, are on the order of 50 Gauss, as shown in FIG. 6, or less.

Electromagnet coils 1000 and 1010 are positioned externally of the chamber shield 106, supported by electromagnet coil supports 1005 and 1015, respectively, as shown in FIG. 2. Electromagnet coil support 1005 may be attached to adapter ring assembly 152, and electromagnet coil support 1015 may be attached to vacuum chamber wall 108. The electromagnet coil 1000 connects, through an adapter ring assembly feedthrough (not shown), to a DC power source, as shown in FIG. 3. The electromagnet coil 1010 also connects, through a vacuum chamber wall feedthrough (not shown), to a DC power source, as shown in FIG. 3. Alternatively, one or both of the electromagnet coils 1000 and 1010 may be connected to an AC power source, which may cause the high density electron cloud 900 to rotate, which can lead to enhanced uniformity of deposition of material from the target 110 onto the substrate 112.

The embodiment of FIGS. 1–5 shows only two electromagnet coils 1000 and 1010 being used, but, of course as few as one electromagnet coil could be used, and as many as ten or more electromagnet coils could also be used, or a combination of electromagnet coils and permanent magnets could be used as well. An advantage of using more electromagnet coils is that more electromagnet coils enable more precise shaping or "bottling" of the high density electron cloud 900, which can increase the effective electron density of the high density electron cloud 900 and lead to enhanced uniformity of deposition of material from the target 110 onto the substrate 112, especially onto the fine features and structures of the substrate 112, particularly those with very high aspect ratios, such as deep, narrow trenches, vias and contact holes.

FIG. 7 shows a schematic, plan view from above of electron trajectories of the deposition systems 100 in accordance with the embodiments of FIGS. 1–5. As shown in FIG. 7, magnetic field lines 1100, generated by electromagnet coils 1000 and 1010, as in the embodiments of FIGS. 1–5, cause the energized electrons in the high density electron cloud 900 to cycle in spiral paths 1200 around the magnetic field lines 1100. As shown in FIG. 7, the electron guns 104 are arranged to inject the energetic electrons substantially tangentially into the interior of chamber shield 106. Also as shown in FIG. 7, an electron at radial (vector) distance r from the center of high density electron cloud 900 has a (vector) velocity v directed tangentially along the spiral path 1200. The spiral paths 1200 shown in FIG. 7 are appropriate for electrons since the magnetic field lines 1100 are coming out of the plane of the figure in FIG. 7. The magnetic component of the Lorentz force in the ith direction $F_{im}$ on an electron moving with velocity $v_j$ in the jth direction in a magnetic field $B_k$ in the kth direction (the directions 1, 2 and 3 forming a right-handed coordinate system) is given by $$F_{im} = -\frac{e}{c} \sum_{j=1}^{3} \sum_{k=1}^{3} \epsilon_{ijk} v_j B_k = -\frac{m_e v^2}{r^2} x_i$$

where the absolute value of the electric charge e of an electron is $1.6021892 \pm 0.0000046 \times 10^{-19}$ Coulombs, the speed of light c is $2.99792458 \pm 0.000000012 \times 10^{10}$ cm/sec, $\epsilon_{ijk}$ is the completely antisymmetric tensor ($\epsilon_{123}=1=\epsilon_{231}=\epsilon_{312}=-\epsilon_{213}=-\epsilon_{132}=-\epsilon_{321}$, all other components vanishing identically), the rest mass of an electron $m_e$ is 0.511 MeV/c$^2$, the magnitude of the electron's velocity is v, the radius of the electron's orbit is r, and the unit vector in the ith direction is $x_i/r$, the last equality following by equating the magnetic component of the Lorentz force on the electron to the centripetal force on the electron. For example, in FIG. 7, with the 1 direction horizontal, the 2 direction vertical and the 3 direction normal to, and coming out of, the plane of the figure, since the magnetic field lines 1100 are coming out of the plane of the figure in the positive 3 direction ($B_1=0$, $B_2=0$, $B_3=B$), when the electron's velocity in the plane of the figure is upward in the positive 2 direction ($v_1=0$, $v_2=v$, $v_3=0$), the magnetic component of the Lorentz force is to the left in the negative 1 direction ($F_{1m}=-\epsilon_{123}ev_2B_3/c=-evB/c$, $F_{2m}=0$, $F_{3m}=0$); when the electron's velocity in the plane of the figure is to the left in the negative 1 direction ($v_1=-v$, $v_2=0$, $v_3=0$), the magnetic component of the Lorentz force is downward in the negative 2 direction ($F_{1m}=0$, $F_{2m}=-\epsilon_{213}ev_1B_3/c=-evB/c$, $F_{3m}=0$); when the electron's velocity in the plane of the figure is downward in the negative 2 direction ($v_1=0$, $v_2=-v$, $v_3=0$), the magnetic component of the Lorentz force is to the right in the positive 1 direction ($F_{1m}=-\epsilon_{123}ev_2B_3/c=evB/c$, $F_{2m}=0$, $F_{3m}=0$); and when the electron's velocity in the plane of the figure is to the right in the positive 1 direction ($v_1=v$, $v_2=0$, $v_3=0$), the magnetic component of the Lorentz force is upward in the positive 2 direction ($F_{1m}=0$, $F_{2m}=-\epsilon_{213}ev_1B_3/c=evB/c$, $F_{3m}=0$), resulting in a counterclockwise rotation of the electron in the plane of the figure, as shown in FIG. 7.

For the counterclockwise rotation of the electron in the plane of the figure, as shown in FIG. 7, equating the magnitudes in the above-given equation for the magnetic component of the Lorentz force gives the radius r of the electron's orbit $$r = \frac{c}{eB}m_e v = \frac{c}{eB}(2m_e E)^{\frac{1}{2}}$$

where the kinetic energy E of the electron is $\frac{1}{2} m_e v^2$ so that $2 m_e E$ is $(m_e v)^2$, the square of the electron's (non-relativistic) momentum. As the kinetic energy E of the electron decreases, for example, as the result of collisions with argon and titanium atoms in the high density electron cloud 900, the radius r of the electron's orbit decreases as $E^{1/2}$, spiraling inward toward a central region of the high density electron cloud 900 within the deposition system 100, as shown by the spiral path 1200 in FIG. 7. Electrons are believed to create ions by colliding with gas and/or metal atoms with sufficient energy. By magnetically trapping electrons, more ionizations are believed to occur.

The chamber shield 106 protects the vacuum chamber walls 108 from the material being deposited. In the illustrated embodiment, the chamber shield 106 is made of a conductive material such as heavy-duty, bead-blasted solid high-purity (preferably 99.995% pure) titanium formed into a generally cylindrical shape having a diameter of 25–36 cm (10–14 inches). However, other highly conductive materials may be utilized depending upon the material being sputtered and other factors.

The material of the structure which will be coated should have a coefficient of thermal expansion which closely matches that of the material being sputtered to reduce flaking of sputtered material from the shield or other chamber internal structure onto the wafer. In addition, the material to be coated should have good adhesion to the sputtered material. Thus for example if the deposited material is titanium, the preferred metal of the shields, brackets and other structures likely to be coated is bead-blasted titanium. Any surfaces which are likely to sputter would preferably be made of the same type of material as the target such as high purity titanium, for example. Of course, if the material to be deposited is a material other than titanium, the preferred metal is the deposited material, stainless steel or copper. Adherence can also be improved by coating the structures with molybdenum prior to sputtering the target. However, it is preferred that the coil (or any other surface likely to sputter) not be coated with molybdenum or other materials since the molybdenum can contaminate the workpiece if sputtered from the coil.

The chamber shield 106 is generally bowl-shaped (FIG. 2) and includes a generally cylindrically shaped, vertically oriented wall 140. The chamber shield 106 further has a generally annular-shaped floor wall 142 which surrounds the pedestal 114 which supports the substrate 112 which has a 20 cm (8") diameter in the illustrated embodiment. A clamp ring 154 may be used to clamp the substrate 112 to the pedestal 114 and cover the gap between the floor wall of the chamber shield 106 and the pedestal 114.

The deposition system 100 is supported by an adapter ring assembly 152 which engages an upper annular flange 150 of the vacuum chamber wall 108. The outer shield 106 is grounded to the system ground through the adapter ring assembly 152. The darkspace shield 130, like the chamber shield 106, is grounded through the adapter ring assembly 152. The darkspace shield 130 also has an upper flange 170 which is fastened to the horizontal flange 162 of the adapter ring assembly 152. The darkspace shield 130, like the chamber shield 106, is grounded through the adapter ring assembly 152.

The target 110 is generally disk-shaped and is also supported by the adapter ring assembly 152. However, the target 110 is negatively biased and therefore should be insulated from the adapter ring assembly 152 which is grounded. Accordingly, seated in a circular channel 176 formed in the underside of the target 110 is a ceramic insulation ring assembly 172 which is also seated in a corresponding channel 174 in the upper side of the adapter ring assembly 152. The insulator ring assembly 172 which may be made of a variety of insulative materials including ceramics spaces the target 110 from the adapter ring assembly 152 so that the target 110 may be adequately negatively biased. The target, adapter and ceramic ring assembly are provided with O-ring sealing surfaces 178 to provide a vacuum tight assembly from the vacuum chamber 102 to the target 110.

To promote uniform erosion of the target 110, a magnetron 116 (FIG. 2) may be provided above the target 110. However, in some applications the magnetron might be omitted by increasing the energetic electron injection ionization of the high density electron cloud 900.

A DC power setting for biasing the target 110 of 3 kW is preferred but a range of 2–5 kW and a pedestal bias voltage of −30 volts DC is believed to be satisfactory for many applications.

The substrate 112 to target 110 spacing is preferably about 140 mm but can range from about 8 cm to 20 cm (3" to 8"). For this substrate 112 to target 110 spacing, a chamber shield diameter of about 36 cm (14 inches) is preferred.

A variety of gases may be utilized in the plasma chamber 100, including Ar, $H_2$ or reactive gases such as $NF_3$, $CF_4$ and many others. Various gas pressures are suitable including pressures of about 0.1 milliTorr or less. For ionized PVD, a pressure less than or equal to about $5 \times 10^{-4}$ Torr (0.5 milliTorr or 500 microTorr) is suitable for ionization of sputtered material.

It will, of course, be understood that modifications of the present invention, in its various aspects, will be apparent to those skilled in the art, some being apparent only after study others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An apparatus for ionizing a deposition material to be deposited on a substrate within a semiconductor fabrication system, the apparatus comprising:

a semiconductor fabrication chamber having a target, a magnetron adjacent said target, a substrate holder, a central axis connecting said substrate holder to said target and a central region which includes said central axis;

at least one electron source positioned to inject energetic electrons into said semiconductor fabrication chamber to form a cloud of electrons in said chamber central region; and an arrangement of magnets independent of said magnetron and positioned to generate a configuration of magnetic fields in said chamber central region including said central axis and having magnetic lines of force oriented generally parallel to said central axis of the semiconductor fabrication chamber to cause said electrons of said electron cloud to cycle within said chamber central region and about said central axis of said semiconductor fabrication chamber.

2. The apparatus of claim 1, wherein said arrangement of magnets includes an electromagnet.

3. The apparatus of claim 1, wherein said electron source includes an electron gun.

4. The apparatus of claim 1 wherein said substrate holder holds a substrate and said configuration of magnetic fields has magnetic lines of force oriented generally perpendicular to the surface of a substrate held by said substrate holder.

5. An apparatus for ionizing a deposition material to be deposited on a substrate within a semiconductor fabrication system, the apparatus comprising:

a semiconductor fabrication chamber having a target of sputterable material, a magnetron adjacent said target, a substrate holder, a central axis connecting said substrate holder to said target, a central region which includes said central axis and a chamber shield which encircles said central region;

at least one electron gun positioned to inject energetic electrons into said semiconductor fabrication chamber to form a cloud of electrons in said chamber central region; and at least one electromagnet independent of said magnetron, wherein each electromagnet encircles said central region, said at least one electromagnet being positioned to generate a configuration of magnetic fields in said chamber central region including said central axis to cause said electrons of said electron cloud to cycle within said chamber central region and about said central axis of said semiconductor fabrication chamber and to ionize material sputtered from said target, wherein said energetic electrons lose energy ionizing said sputtered material and said configuration of magnetic fields within said semiconductor fabrication chamber keeps said electrons away from said chamber shield so that said electrons losing energy spiral inward toward said central axis of said central region of said semiconductor fabrication chamber.

6. The apparatus of claim 5 wherein said at least one electron gun injects said energetic electrons into said semiconductor fabrication chamber substantially tangentially to said chamber shield.

7. The apparatus of claim 5, wherein said target includes titanium and said chamber shield includes titanium.

8. The apparatus of claim 5, wherein said target includes aluminum and said chamber shield includes aluminum.

9. The apparatus of claim 5 including:

a source for applying a bias to said substrate to attract said ionized sputtered material.

10. An apparatus for ionizing a sputtered deposition material to be deposited on a substrate within a semiconductor fabrication system, the apparatus comprising:

a semiconductor fabrication chamber having a target of a deposition material, a magnetron adjacent said target, a substrate holder, a surrounding chamber shield and a central axis connecting said target to said substrate holder and a central region within said surrounding chamber shield and including said central axis;

a plurality of electron guns arranged substantially tangentially around said chamber shield with portions of said electron guns passing through said chamber shield to inject energetic electrons into said semiconductor fabrication chamber to form a cloud of electrons in said chamber central region; and at least one electromagnet independent of said magnetron, wherein each electromagnet encircles said central region, said at least one electromagnet being positioned to generate a configuration of magnetic fields in said chamber central region including said central axis to cause said electrons of said electron cloud to cycle within said chamber central region of said semiconductor fabrication chamber and to ionize sputtered material from said target, wherein said energetic electrons lose energy ionizing said sputtered material and said configuration of magnetic fields within said semiconductor fabrication chamber keeps said electrons away from said chamber shield so that said electrons losing energy spiral inward toward said central axis of said central region of said semiconductor fabrication chamber.

11. A method of depositing material on a substrate, the method comprising:

providing a magnetic field from a magnetron adjacent a target;

sputtering material from said target aligned with said substrate in a chamber;

injecting energetic electrons into said chamber to form a cloud of electrons in a central region of said chamber wherein said central region includes a central axis connecting said substrate to said target; and providing a configuration of magnetic fields in said central region including said central axis and having magnetic lines of force oriented generally parallel to said central axis of the chamber using a magnet independent of said magnetron to cycle said electrons of said cloud of electrons in said chamber central region and about said central axis, to ionize said sputtered material from said target.

12. The method of claim 11 including varying a biasing of said substrate.

13. The method of claim 11, wherein magnet providing said configuration of magnetic fields is an electro-magnet.

14. The method of claim 11, wherein said said providing of said configuration of magnetic fields further keeps said electrons away from a chamber shield surrounding said chamber central region so that said electrons lose energy ionizing material sputtered from said target, and said electrons spiral inward toward said central axis of said central region.

15. The method of claim 14 wherein said injecting comprises using at least one electron gun to inject said energetic electrons into said chamber substantially tangentially to said chamber shield.

16. The method of claim 11 wherein said configuration of magnetic fields has magnetic lines of force oriented generally perpendicular to a surface of the substrate.

17. A method of depositing material on a substrate, the method comprising:

providing a magnetic field from a magnetron adjacent a target aligned with said substrate in a chamber;

sputtering material from said target;

injecting energetic electrons into a central region of said chamber using a plurality of electron guns arranged substantially tangentially around a chamber shield with portions of said electron guns passing through said chamber shield, to form a cloud of electrons in said central region, wherein said central region includes a central axis connecting said substrate to said target; and providing a configuration of magnetic fields in said central region including said central axis using a pair of axially spaced electromagnets encircling said shield and independent of said magnetron to cycle said electrons of said cloud of electrons in said chamber central region about and toward said central axis.

18. The method of claim 17 including varying a biasing of said substrate.

19. The method of claim 17, wherein said providing a configuration of magnetic fields further keeps said electrons away from said chamber shield surrounding said chamber central region so that said electrons lose energy ionizing material sputtered from said target, and spiral inward within said central region toward said central axis of said semiconductor fabrication chamber.

20. An apparatus for ionizing a deposition material to be deposited on a substrate within a semiconductor fabrication system, comprising:

a semiconductor fabrication chamber having a target of deposition material, a magnetron adjacent said target; a substrate holder, a central axis connecting said substrate holder to said target, a central region including said central axis, and a chamber shield surrounding said central region;

a plurality of electron guns arranged substantially tangentially around said chamber shield with portions of said electron guns passing through said chamber shield and positioned to inject energetic electrons into said semiconductor fabrication chamber to form a cloud of electrons in said chamber central region; and a pair of axially spaced electromagnets encircling said shield and positioned to generate a configuration of magnetic fields positioned in said chamber central region including said central axis and having magnetic lines of force oriented generally parallel to said central axis of the semiconductor fabrication chamber to cause said electrons of said electron cloud to cycle within said central region of said semiconductor fabrication chamber and about said said central axis, and to ionize deposition material from said target.

21. The apparatus of claim 20 wherein said substrate holder holds a substrate and said configuration of magnetic fields has magnetic lines of force oriented generally perpendicular to the surface of a substrate held by said substrate holder.

22. An apparatus for ionizing a deposition material to be deposited on a substrate within a semiconductor fabrication system, comprising:

a semiconductor fabrication chamber having a target of deposition material, a magnetron adjacent said target; a substrate holder adapted to hold a substrate, a central axis connecting said substrate holder to said target, a central region including said central axis, and a chamber shield surrounding said central region;

a plurality of electron guns arranged substantially tangentially around said chamber shield with portions of said electron guns passing through said chamber shield, said electron guns having means for injecting energetic electrons substantially tangentially into said semiconductor fabrication chamber to form a cloud of electrons in said chamber central region; and magnetic field means including a pair of axially spaced electromagnets encircling said shield, for generating a configuration of magnetic fields positioned in said chamber central region including said central axis to cause said electrons of said electron cloud to cycle within said central region of said semiconductor fabrication chamber and about said central axis, and to ionize deposition material from said target, wherein said configuration of magnetic fields has magnetic lines of force oriented generally parallel to said central axis of the semiconductor fabrication chamber and generally perpendicular to a surface of the substrate held by said substrate holder and wherein said energetic electrons lose energy ionizing said sputtered material and said configuration of magnetic fields within said semiconductor fabrication chamber keeps said electrons away from said chamber shield so that said electrons losing energy spiral inward toward said central axis of said central region of said semiconductor fabrication chamber.

* * * * *